United States Patent
Otto et al.

(10) Patent No.: US 6,188,921 B1
(45) Date of Patent: Feb. 13, 2001

(54) SUPERCONDUCTING COMPOSITE WITH HIGH SHEATH RESISTIVITY

(75) Inventors: Alexander Otto, Chelmsford; Ralph P. Mason, Ashland; Craig J. Christopherson, Worcester; Peter R. Roberts, Groton, all of MA (US)

(73) Assignee: American Superconductor Corporation, Westborough, MA (US)

( * ) Notice: Under 35 U.S.C. 154(b), the term of this patent shall be extended for 0 days.

(21) Appl. No.: 09/240,998

(22) Filed: Feb. 1, 1999

Related U.S. Application Data

(60) Provisional application No. 60/074,258, filed on Feb. 10, 1998.

(51) Int. Cl.⁷ .................................................. H01B 12/00
(52) U.S. Cl. ............................. 505/230; 505/704; 427/62
(58) Field of Search .................................... 505/230, 704; 174/125.1; 427/62

(56) References Cited

U.S. PATENT DOCUMENTS

| | | |
|---|---|---|
| 4,251,328 | 2/1981 | Tunder . |
| 4,700,257 | 10/1987 | Bekhaled . |
| 5,017,553 | 5/1991 | Whitlow et al. . |
| 5,296,456 | 3/1994 | Shiga et al. . |
| 5,298,679 | 3/1994 | Wu et al. . |
| 5,304,534 * | 4/1994 | Ciszek .................................. 505/434 |
| 5,617,280 | 4/1997 | Hara et al. . |
| 5,625,332 | 4/1997 | Kamo et al. . |
| 5,661,114 * | 8/1997 | Otto et al. ............................. 505/121 |
| 5,663,528 * | 9/1997 | Tanaka et al. ..................... 174/125.1 |
| 5,912,607 | 6/1999 | Kalsi et al. . |
| 5,929,000 * | 7/1999 | Hahakura et al. .................... 505/231 |
| 5,994,275 * | 11/1999 | Otto et al. ............................. 505/121 |

FOREIGN PATENT DOCUMENTS

| | | |
|---|---|---|
| 197 46 975 | 11/1994 | (DE) . |
| 0 786 783 | 7/1997 | (EP) . |
| 6-309955 | 11/1994 | (JP) . |
| WO94/03955 | 2/1994 | (WO) . |
| 98/14961 | 4/1998 | (WO) . |
| WO00/10176 | 2/2000 | (WO) . |

OTHER PUBLICATIONS

Le Lay, et al., "Over Critical–Current Behaviour of Bi–2223 Tapes for Fault Current Limiters", *Applied Superconductivity Conference*, 9(2): 1324–27, 1999.

Hikichi, et al., "Development of Ag–Mg–α Alloy Sheathed Bi2223 Multifilament Tapes", *Springer–Verlag*, 2: 915–18, 1998.

XP–002146742, *Derwent Publications Ltd.*, Abstract.

* cited by examiner

*Primary Examiner*—Shrive Beck
*Assistant Examiner*—Bret Chen
(74) *Attorney, Agent, or Firm*—Choate, Hall & Stewart; Elizabeth E. Nugent

(57) ABSTRACT

A superconducting article having a high bulk sheath resistivity, and methods of manufacture of such an article. High-temperature superconductor filaments are disposed in a ductile matrix comprising a high silver content. The matrix is then coated with a solute and heated to a temperature high enough to allow the solute to diffuse into the matrix, but not high enough to allow substantive degradation or poisoning of the superconductor. After diffusion and cooling, the matrix comprises a silver alloy having a higher bulk resistivity than the pure silver.

20 Claims, 2 Drawing Sheets

_US 6,188,921 B1_

SUPERCONDUCTING COMPOSITE WITH HIGH SHEATH RESISTIVITY

This application claims benefit and priority of U.S. Provisional Application No. 60/074,258, filed Feb. 10, 1998, which is incorporated herein by reference.

FIELD OF THE INVENTION

The present invention is related to oxide superconductor composites having high sheath resistivity.

BACKGROUND OF THE INVENTION

Oxide superconducting wires and cables typically consist of many filaments of superconducting material within a metal matrix which separates the filaments from each other and from the local environment. The matrix is typically a non-superconducting metal. Silver and its alloys represent the matrix metals of choice because the silver is ductile, chemically benign with respect to the oxide superconductor material and relatively transparent to oxygen.

Recent advances in the development of oxide superconductors have demonstrated their utility in applications such as power transmission cables, fault current limiters, utility inductors, motors and generators. For optimal performance, however, many of these applications require matrix resistivities which are much higher than that of pure silver at use (i.e., cryogenic) temperatures. Pure silver has a resistivity at 80 K of about 0.2–0.5 $\mu\Omega$-cm, and this value decreases by an order of magnitude as the temperature drops to 4 K. As the term is used herein, resistivity is defined as the bulk resistivity as determined by measuring the current flow in a wire and applying the formula $$\rho = \frac{VA}{Ix} \quad (1)$$

where $\rho$ represents resistivity, V represents voltage measured over wire length x, A represents the cross-sectional area of the wire, and I represents current.

There are many technical difficulties associated with the manufacture of an oxide superconductor having a high resistivity sheath. For example, processing steps associated with the formation of the high resistivity sheath may not be compatible with the processing of the oxide superconductor. In particular, under high temperature conditions used to form oxide superconductor phases, many of the sheath components likely to impart high resistivity to the sheath react with and poison the oxide superconductor. In addition, metals which are chemically compatible with the oxide superconductor and the sheath metal typically are highly electrically conductive.

One approach to increasing matrix resistivity consists of the introduction of fine oxide particles into the metal matrix to form a dispersed oxide/matrix metal alloy ("oxide-dispersion strengthened" or ODS silver); however, this requires relatively large volume fractions of the oxide phase in order to sufficiently raise the bulk resistivity of the matrix. Such an approach is limited because an increase in the oxide content of the matrix metal increases its brittleness. Thus, only modest increases in resistivity, e.g., 1–2 $\mu\Omega$-cm, are possible while maintaining a matrix with acceptable mechanical properties. In order not to crack in ordinary coiling and winding operations, the matrix should have a tensile fracture strain of at least 0.5%. Fracture strains of higher than 1% are preferred for practical handling of the superconducting composite. In addition, the oxide precipitates used in ODS silver often interact detrimentally with the oxide superconductor and tend to degrade the superconducting properties of the composite.

In another approach, a metal may be alloyed with the sheath metal prior to composite fabrication to raise the resistivity of the sheath. While many metals may be readily alloyed and incorporated into the metal sheath, this process requires that the solute metal be present during high temperature processing of the oxide superconductor. Unfortunately, known low-cost solutes which significantly increase resistivity typically poison the superconductor or themselves are subject to oxidation under these processing conditions.

Shiga et al. in U.S. Pat. No. 5,296,456 disclose alloying a variety of metals with the metal sheath covering the oxide superconductor to obtain high conductivity (low resistivity) and low conductivity (high resistivity) regions in the sheath. As is discussed in greater detail below, most of the metals disclosed by Shiga et al. are not very effective for increasing electrical resistivity. Further, many metals which are highly effective in raising the net resistivity of the matrix are not good candidates for alloying with the metal sheath because they tend to readily form second phases, e.g., intermetallic compounds, within the matrix metal. Intermetallics tend to embrittle the matrix, and do not raise net resistivity sufficiently.

Due to the limitations of prior art processes, a need remains for sheathed oxide superconducting composites which combine suitably high resistivity with good superconducting properties.

SUMMARY OF THE INVENTION

It is an object of the present invention to provide an oxide superconductor composite with high sheath resistivity and, in particular, high bulk sheath resistivity.

It is a further object of the invention to provide a method of obtaining a high resistivity sheath without deleterious effect on the electrical properties of the article.

It is yet a further object of the invention to provide a process for making an oxide superconductor composite having a high sheath resistivity, where the process is adaptable to continuous or bulk processing of composites.

It is another object of the invention to identify materials of suitable resistivity and compatibility with the oxide superconductor for use in the high resistivity sheath of the invention.

In one aspect, the invention comprises a composite oxide superconductor article comprising one or more oxide superconducting members in a silver-containing matrix. The matrix has a resistivity of at least 3 $\mu\Omega$-cm, preferably of greater than 5 $\mu\Omega$-cm, and most preferably in the range of 5–25 $\mu\Omega$-cm. The matrix does not comprise any metallic element having a boiling point below 380° C. at one atmosphere pressure. The matrix further has a tensile fracture strain of at least 0.5%, and preferably of at least 1%. The matrix may also have a bend fracture strain of at least 0.5%, or preferably of at least 1%. The matrix may comprise a silver-rich solid solution with one or more other elements, such as gallium, tin, cadmium, zinc, indium, or antimony. The solute element may be selected so as to be able to diffuse into a silver matrix in less than twenty hours at a temperature of less than 550° C., and/or to have a diffusivity in silver at less than 550° C. of at least $10^{-12}$ cm$^2$/s. The solute element may represent at least 2 atm % of the matrix composition, preferably at least 4 atm %, more preferably 4–50 atm %, and most preferably 4–18 atm %. The matrix material may be fine grained, with a grain size of less than 50 μm, or preferably in the range of 0.1–15 μm. The oxide superconducting member preferably may comprise BSCCO 2223 phase, BSCCO 2212 phase, or a member of the YBCO family, and may have a critical temperature of at least 70 K. The engineering current density of the superconductor article may be at least 3,000 A/cm$^2$ at a temperature less than or equal to 90 K (as measured by a 1 μV/cm criterion).

In another aspect, the invention comprises a method of preparing an oxide superconductor. After formation of an article comprising at least one oxide superconductor member in a silver-containing matrix, the method comprises coating the article with a solute capable of forming a silver-rich solid solution, heating the coated article for a time sufficient to allow the solute to diffuse into the matrix to form the solid solution, and cooling the article to a temperature at which substantially no further diffusion occurs. The heating step is carried out at a temperature below the boiling temperature of the solute at one atmosphere pressure, and preferably at a temperature at which the vapor pressure of the solute is less than or equal to 0.1 atmospheres. The solute element may be chosen from a material system which possesses a thermodynamically stable second phase with silver, and cooled sufficiently rapidly to prevent formation of this phase. The article may be coated by any of a number of processes, including chemical vapor deposition, physical vapor deposition, dip coating, roll coating, gravure roll printing, doctor blading, stamping, sputtering, electrochemical deposition, laser ablation, and plasma spraying. The solute may be a metal such as gallium, tin, cadmium, zinc, indium, or antimony, and may be selected to have a diffusivity in silver of at least $10^{-12}$ cm$^2$/sec at a temperature below 550° C. If the solute is gallium, it may have a concentration in the range of 3–18 atm %. The heating temperature may be selected so that the formation of second phases is not favored, for example in the range of 380° C.–520° C. when the solute is gallium. The heating and cooling steps may be accomplished sufficiently rapidly that the formation of second phases rich in solute is suppressed. The composite may be held at the heating temperature for a period of less than or equal to 20 hours. The superconducting member of the article may comprise the desired final superconducting phase.

In yet another aspect, the invention comprises a method of preparing an oxide superconductor article having a high resistivity sheath. After formation of an article comprising at least one oxide superconductor member in a silver-containing matrix, the method comprises exposing the article to an environment containing one or more solute elements capable of forming a silver-rich solid solution, at an elevated temperature and other conditions which favor diffusion of the solute into the matrix, and holding the article in that environment for a time sufficient for such diffusion to occur. The elevated temperature is less than the boiling point of the solute element at one atmosphere pressure. The method further comprises cooling the composite article to a temperature at which substantially no further diffusion occurs. The solute element may be chosen from a material system which possesses a thermodynamically stable second phase with silver, and cooled sufficiently rapidly to prevent formation of this phase. The environment may be held at a temperature of less than 550° C., and cooling may be carried out at a rate of at least 1° C./min, or preferably of at least 10° C./min, or more preferably of at least 20° C./min. The environment may comprise a liquid metal bath or a vapor phase containing the solute element. The solute element may be a metal such as gallium, tin, cadmium, zinc, indium, or antimony.

In a further aspect, the invention comprises a method of preparing an oxide superconductor having a high resistivity sheath. After formation of a superconducting composite article comprising an oxide superconducting member in a silver-containing sheath, the method comprises exposing this article to an environment which favors formation of a silver-rich solid solution with an increased resistivity, and which does not favor the formation of second phases. The environment comprises a solute element whose boiling point is above the given temperature at the given pressure, and which is capable of forming the silver-rich solid solution. The article is maintained in this environment for a sufficient time to form the solid solution, and then the environment is adjusted to a condition in which diffusion of solute into the matrix is substantially suppressed. The environment may be so changed by changing the temperature, pressure, partial pressure of solute, or combinations thereof. The rate of change of the environment is selected so that formation of second phases in the matrix is substantially prevented.

In still another aspect, the invention provides methods of electroplating gallium onto the surface of a superconducting composite, by applying a potential to the composite and an electrode in a gallium-containing electrolyte.

By "silver-rich solid solution" as that term is used herein, it is meant a composition having more than 50 atm % (atomic percent) silver, preferably more than 75 atm % silver and most preferably greater than 82 atm % silver.

By "second phase" as that term is used herein, it is meant a phase comprising the solute element, other than the superconductor phases, which is chemically distinct from the desired resistivity-enhanced silver-rich phase. Common second phases are "intermetallic compounds" or "intermetallics." Such compositions are characterized by decreased fracture strains, as compared to the corresponding solid solution. They may also provide a barrier to further diffusion of the solute metal into the matrix metal.

Unless otherwise noted, "resistivity" refers to bulk resistivity of the matrix which is determined across the many grains of the matrix material along the wire axis.

By "reactive conditions" as that term is used herein, it is meant conditions which are sufficient to create favorable kinetic conditions for reaction of the oxide superconductor with the solute element, or for significant degradation of the electrical properties of the oxide superconductor.

By "engineering critical current density" as that term is used herein, it is meant the total critical current of the superconducting members of a superconducting composite, divided by the cross-sectional area of the entire composite, including both superconducting oxide filaments and silver-rich matrix. This quantity is denoted by $J_e$.

BRIEF DESCRIPTION OF THE DRAWING

The invention is described with reference to the several figures of the drawing, in which.

DETAILED DESCRIPTION

Figure 1:
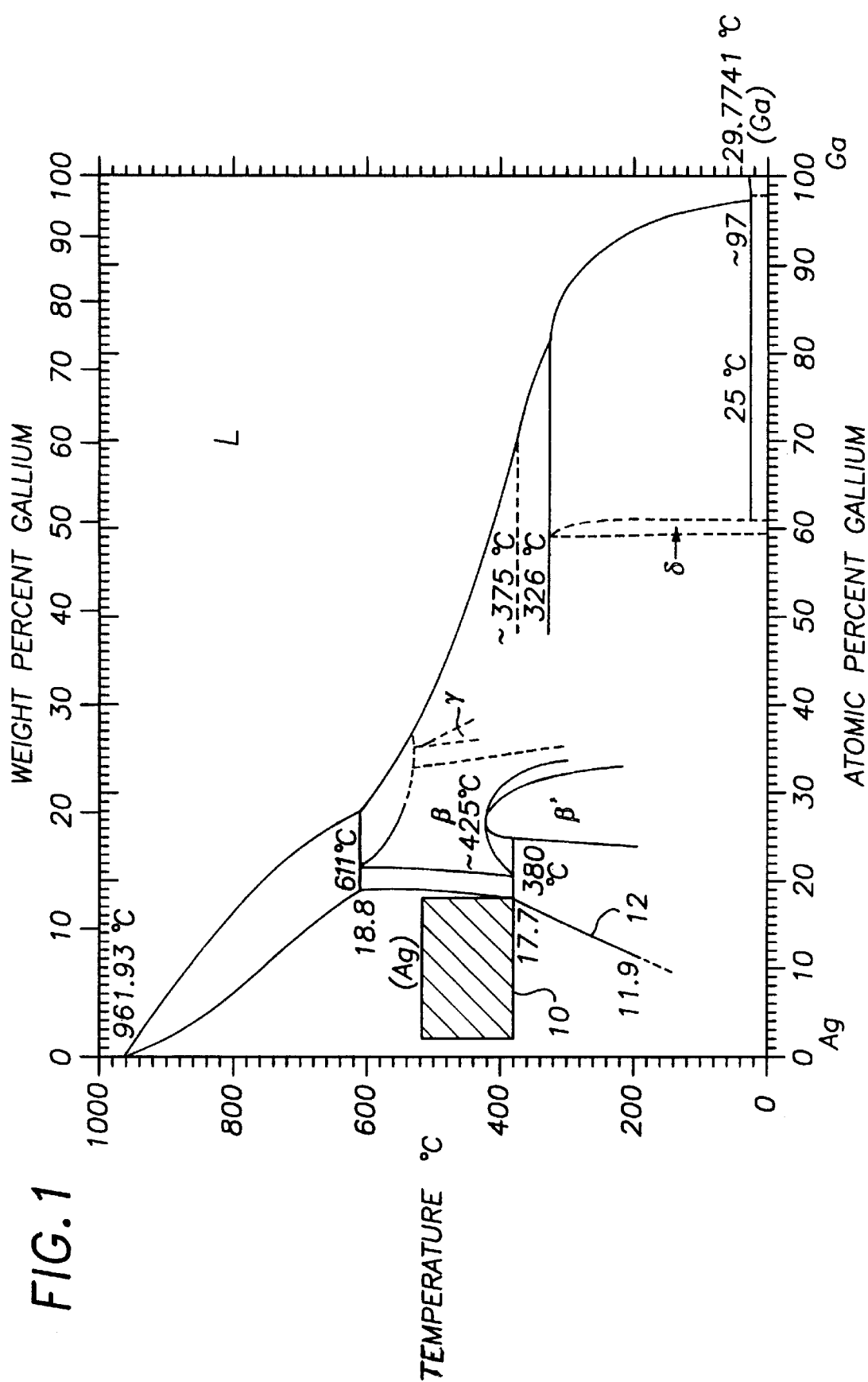
FIG. 1 illustrates the preferred conditions for practice of the invention on the silver-gallium phase diagram.

The composite of the present invention is well suited, for example, for use in current limiters where the composite demonstrates a high resistivity for currents beyond its intended operating current level. By increasing the resistivity of the sheath, the composite wire cannot carry significant excess current beyond the critical current of the superconductor even when increased voltages are applied. In normal superconducting composites which comprise one or more oxide filaments encased in a metal sheath, the sheath material and the superconductor constitute a parallel circuit. When the current is increased to a level which drives the electric current above the critical current carrying capacity of the superconducting element, its resistivity is abruptly increased to high levels (greater than 25 $\mu\Omega$-cm). Excess current may then flow through the sheath material. To limit this excess current, it is desirable that the sheath have a high resistivity.

In one aspect of the invention, an oxide superconductor article is provided which possesses high bulk resistivity in the matrix. The net bulk resistivity of the matrix is greater than 3 $\mu\Omega$-cm, typically in the range of 5–25 $\mu\Omega$-cm at $T \leq T_c$. This represents a significant increase over bulk resistivities of previously reported oxide superconductor composites.

The matrix resistivity is attained by formation of a solid solution of the matrix metal with at least one solute element. The solute desirably comprises one or more elements which result in a large increase in the resistivity of silver when added in modest quantities.

It is not necessary that the solute be distributed uniformly in the matrix, as long as the bulk resistivity of the matrix is increased sufficiently. For example, the solute may be localized to the vicinity of the grain boundaries, and still provide a substantial increase in resistivity, as long as no interconnected pathway of low-resistivity material exists in the metal.

Suitable alloying elements are capable of imparting resistivity to the matrix, such that the bulk resistivity of the matrix increases. Elements with the greatest impact on alloy resistance are generally most preferred; however, suitable elements also demonstrate high diffusivity in silver and the ability to form solid solutions with silver at low temperatures. In particular, it is desirable that the solute have a melting point below 600° C. and preferably a melting point below 200° C. Low melting point metals may be easily applied (as is discussed hereinbelow) at temperatures well below those which would affect the phase composition of the oxide superconductor. However, it is also desirable that the boiling point of the solute at one atmosphere pressure be above the processing temperature, as the handling of liquids is much simpler than the handling of vapors. By way of example only, suitable solute metals which are anticipated to form high resistivity, solid-solution alloys with silver under mild conditions include tin (Sn), gallium (Ga), cadmium (Cd), zinc (Zn), indium (In) and antimony (Sb) and alloys thereof. One or more solute elements may be used.

As discussed above, Shiga et al. has disclosed a method of producing a high-resistivity surface layer in an HTS/metal composite, in order to reduce AC losses due to eddy currents, and to reduce the thermal conductivity of the wire. Shiga et al. is not concerned with reducing conductivity throughout the metal regions of the wire, but only within a thin surface layer. High diffusivity in silver is thus less important for the technique of Shiga et al. than for the present invention, and a different set of processing conditions and preferred metals is therefore recommended.

For the practice of the present invention, the matrix preferably has a fine grained structure, particularly when the primary diffusion path of the solute is via grain boundaries. The finer the grain size of the matrix, the greater the interface area available for the infusion of the resistivity-conferring solute within the matrix. For the purposes of the present invention, fine grained shall mean a grain size of less than 50 $\mu$m and preferably in the range of 0.1 to 15 $\mu$m. Such grain sizes may be achieved, for example, by the addition of a small quantity of a boundary-pinning phase, such as fine oxide particles. The matrix may be silver or a silver alloy. Silver is particularly well suited as a matrix because of its inertness to oxidation and to the oxide superconductor at typical formation temperatures for oxide superconductors, and because of its formability. Alloying elements which are added before formation of the desired superconducting phase preferably share this inertness to oxidation and to the oxide superconductor at formation temperatures.

Adding a solute having a significantly different atomic radius from that of a pure metal usually has an effect of changing the lattice parameter of the material, and thereby straining it. When strain is introduced into one component of a composite system, residual stresses and strains can arise. In the case of a silver/superconductor composite, such stresses and strains may introduce defects into the brittle superconductor phase upon cooling to operating temperature (e.g., 77 K). It has been found that this effect is most pronounced for short lengths of wire. This effect can be reduced or eliminated by mechanical stabilization of the monofilament tapes. The mechanical stabilization process involves attaching a tape on one or both sides to a stiff mechanical support after the diffusion step. Attachment may be, for example, by soldering or by bonding with epoxy or other known adhesive. Suitable supports include stainless steel or fiberglass plates.

The invention may be practiced with any desired oxide superconductor or its precursors. By "desired oxide superconductor" is meant the oxide superconductor intended for eventual use in the finished article. Typically, the desired oxide superconductor is selected for its superior electrical properties, such as high critical temperature or critical current density. The desired oxide superconductor is typically a member of a superconducting oxide family which has demonstrated superior electrical properties, for example, BSCCO 2223 or BSCCO 2212 in the BSCCO family. By "precursor" is meant any material that can be converted to an oxide superconductor upon application of a suitable heat treatment. Precursors may include any combination of elements, metal salts, oxides, suboxides, oxide superconductors which are intermediate to the desired oxide superconductor, or other compounds which, when reacted in the stability field of a desired oxide superconductor, produces that superconductor. For example, there may be included elements, salts, or oxides of copper, yttrium, and barium for the YBCO family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. The YBCO family of oxide superconductors is considered to include all oxide superconductors of the type comprising barium, copper, and a rare earth selected from the group consisting of yttrium, lanthanum, neodymium, samarium, europium, gadolinium, terbium, dysprosium, holmium, erbium, thulium, ytterbium, and lutetium. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure amenable to texturing, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

The three-layer, high-$T_c$ phase of a member of the BSCCO family of superconductors (BSCCO 2223), such as $Bi_2Sr_2Ca_2Cu_3O_x$ or $[Bi_{1-y}Pb_y]_2Sr_2Ca_2Cu_3O_x$ (0<y<0.5), is the desired superconducting oxide most preferred for the operation of the present invention. Composites including BSCCO 2223 have demonstrated the potential for superior mechanical and electrical performance at long lengths when adequately textured. $Bi_2Sr_2Ca_1Cu_2O_x$ and $[Bi_{1-y}Pb_y]_2Sr_2Ca_1Cu_2O_x$ (BSCCO 2212) are also preferred materials for the practice of the invention.

A typical method of manufacture of the high resistivity matrix composites of the invention involves application of a layer of the solute composition to the composite after it has been processed into a fully sintered oxide superconductor composite, followed by diffusion of the solute into the matrix to form a solid solution. The solute preferably diffuses into the matrix along grain boundaries, which promotes the facile penetration of the solute into the matrix bulk, but solutes whose primary transport mechanism is bulk diffusion are also suitable for the practice of the invention, as long as acceptable transport rates can be achieved at a temperature which does not adversely affect the properties of the composite.

The extent to which the solute favors grain boundary diffusion is determined, in part, by the chemical system, i.e., the composition of the matrix and the diffusing elements, and the processing conditions. While both grain boundary and bulk diffusion rates increase at higher temperatures, grain boundary diffusion typically is predominant at lower temperatures. The interested reader may find more information on diffusion pathways and typical high- and low-temperature behavior in many materials science texts, including Reed-Hill, et al, *Physical Metallurgy Principles*, PWS-KENT Publishing, 1992 (chapter 12).

Many solute elements will degrade a superconducting oxide when present under reactive conditions. It is therefore desirable that such conditions be avoided when the solute element is present in the matrix. This is difficult when the alloyed matrix is formed before the oxide superconductor, since the conditions under which the oxide superconductor is formed are necessarily reactive conditions. Therefore, the high resistivity component preferably is introduced at low temperatures and at a point in the manufacture of the superconducting composite when no further treatments under reactive conditions will occur.

In summary, it is desirable to introduce the high resistivity component into the matrix at a point after the oxide superconductor has been formed, noted herein as a "post-processing step." By "post-processing step" as that term is used herein, it is meant a procedure which is carried out after processing to obtain the desired oxide superconductor is completed. The oxide superconductor, thus processed, possesses all the electrical properties required for its intended use, for example, appropriate composition, oxide grain morphology and alignment, critical transition temperature, and current carrying ability. The post-processing step(s) desirably is carried out at low temperatures in order to prevent degradation of the superconducting properties of the composite. The post-processing step(s) may be carried out at a temperature in the range of ambient to 600° C., and is preferably carried out at a temperature below 550° C., but high enough to ensure rapid diffusion of the solute in the matrix, in order to prevent degradation of the oxide superconductor.

The alloying process may be accomplished by heating the oxide superconductor composite in the presence of a solute. The solute may be present as a vapor or liquid in contact with the composite. When the solute is present in the form of a vapor or a liquid having a high vapor pressure, it will generally be found necessary to hold the composite in a pressure vessel or similar sealed environment in order to avoid loss of solute. This restriction imposes severe constraints on the processing of large volumes of material, and may render continuous processing impractical or even impossible.

The alloying process may be accomplished by depositing the solute composition onto an exterior surface of the oxide superconductor composite and heating, whereby the solute diffuses into the matrix. The solute may be deposited by any conventional method, including but not limited to chemical vapor deposition, physical vapor deposition, dip coating, roll coating, gravure roll printing, stamping, sputtering, electrochemical deposition, doctor blading a powder onto the composite external surface, application of a slurry paste onto the external surface of the composite followed by a bake out heat treatment, laser ablation and plasma spraying. Descriptions of these and other coating techniques can be found in standard coating references, including Cohen, et al., *Modern Coating and Drying Technology*, VCH Publ., 1992, and Schweizer, et al. (Eds.), *Liquid Film Coating*, Chapman-Hall, 1997. Some preferred methods of applying the solute metal are roll coating and meniscus/gravity controlled dip coating, further described below. Because grain boundary diffusion is readily accomplished at lower temperatures than bulk diffusion for grain boundary-favoring elements, the process may be conducted at low temperatures when these elements are used as solute metals, thereby minimizing the possibility that the superconducting properties will be degraded.

It is desirable to accomplish the diffusion of the solute into the matrix while minimizing the formation of brittle intermetallic phases in the matrix, since these phases will tend to substantially reduce the fracture strain of the superconducting composite if present in significant quantities. For some solute metals, this can be accomplished by coating the silver matrix with a quantity of the solute metal at a low temperature, and then heating the superconducting composite to a selected diffusion temperature. The composite is held at this temperature for a time sufficient to diffuse the solute metal into the silver matrix, and then the composite is cooled back to a low temperature. For an understanding of the mechanics of this process, we examine the thermodynamics and kinetics of the particular case of a silver-gallium alloy.

A portion of the silver-gallium phase diagram is given as FIG. 1. It will be seen that two intermetallic phases exist in the silver-rich regions of the diagram: a high-temperature β phase, and a low-temperature β' phase. Shaded region 10 shows a preferred range of temperatures and compositions for which a single-phase solid solution of gallium in silver is favored.

When pure gallium and pure silver are placed in contact and heated slowly, the gallium melts at 30° C., and begins to diffuse into the silver primarily along grain boundaries. The region of the silver near the interface becomes gallium-rich, and intermetallic β' forms because gallium diffusion into the bulk is relatively slow. When the same metals are placed in contact and heated rapidly, transport of gallium into the silver is rapid, and if the amount of gallium is small relative to the amount of silver (e.g., less than about 18 atm %), all of the gallium can diffuse into the silver and be held stably in solid solution. If the metal is then slowly cooled, β' will nucleate and grow when line 12 is crossed on the phase diagram. If the metal is rapidly cooled below a temperature at which gallium is mobile, this nucleation can be suppressed, and the metal will remain substantially composed of a solid solution of gallium in silver. Even if some β' phase is nucleated, its growth will be sufficiently slow at temperatures below about 150° C. that the volume fraction of intermetallic phase will remain small, and the intermetallic precipitates will be well-dispersed.

Hatched region 10 on the phase diagram shows the region which has been found to be preferred for the practice of the invention, namely, a temperature range of from 380 to 550° C., and a composition range of from 2 to 18 atm % gallium. BSCCO 2223 phase has been shown to be substantially unaffected by temperatures in this range for the hold time required for gallium to diffuse evenly through a 0.02–0.2 mm silver matrix. It is expected that suitable processing conditions exist for other low-melting point metals which have such a silver-rich solid solution phase field, such as tin, cadmium, zinc, indium, and antimony. These metals are therefore also suitable for the practice of the invention.

One method of applying a reproducible amount of liquid metal such as gallium to the surface of a silver sheath is roll coating. Various roll coating techniques exist; in general, they comprise applying a controlled amount of liquid to a roller, which in turn applies the liquid to the surface of the sheath. The amount of liquid applied to the roller may be controlled, for example, by the use of an applicator roll, which is partially immersed in a liquid coating bath, and which is held at a controlled small distance from the main roll, so that a well-defined quantity of liquid is applied to the main roll. Other methods of controlling the amount of liquid applied include fountain application, thinning with a gas knife, or application with a doctor blade. These and other roll coating techniques are known in the art and are discussed in more detail in *Gravure: Process and Technology,* distributed by the Gravure Association of America (1991).

Another method of applying a reproducible amount of liquid metal such as gallium to the surface of a silver sheath is a meniscus/gravity controlled dip coating. In this method, a composite superconductor wire or tape is immersed in a liquid metal bath, and is pulled upward out of the bath at a constant rate. This process deposits an even coating of liquid metal on the wire, whose thickness is a function of the surface energy and density of the liquid metal, and of the pulling speed of the wire. It has been found that for producing even and reproducible coatings of gallium on silver, it is desirable to clean the silver sheath to give it a uniform surface energy. One process which has been found suitable is a two-step process involving ultrasonically cleaning the sheath first in a bath of CITRANOX™, an anionic liquid detergent, and then in a distilled water bath.

Another method of applying a reproducible amount of gallium or another liquid metal to the surface of a silver sheath is wave coating followed by thinning with a "gas knife." In this technique, the superconducting composite wire or tape is passed through a chamber where it is inundated by a liquid metal "wave," and thus receives a heavy coating of molten metal. Excess metal is then pared away from the surfaces of the tape by jets of inert gas from upper and lower nozzles, leaving a thin and even layer. The gas exiting the nozzles may be any desired composition; preferred compositions for gas knife paring of a wave coating of gallium are Cu-gettered argon, nitrogen, helium, or carbon dioxide. The thickness of the final coating is a function of (at least) the composition and application temperature of the liquid metal, the temperature, composition, and velocity of the gas jet, and the speed of initial coating of the wire or tape. In one preferred embodiment, the wire or tape may be cooled to solidify the liquid metal before spooling at the apparatus exit. Alternatively, the wire or tape may be passed directly into a furnace for quick heating to diffuse the liquid metal into the matrix of the superconducting composite.

Yet another method for deposition of gallium or other metals onto the sheath surface is electroplating. A method of brush plating gallium is described in U.S. Pat. No. 4,521, 328. We have also devised an immersion method of gallium plating using gallium dissolved to a concentration of 20 g/l to 130 g/l in a caustic solution such as sodium hydroxide or potassium hydroxide. Possible gallium sources include $Ga_2O_3$, $Ga(OH)_3$, $GaCl_3$, $Ga_2O$, $Ga_2(SO_4)_3$, and $Ga(NO_3)_3$. A DC plating cell is run with a current density on the order of 1 A/cm$^2$, using the HTS composite as the cathode and any material which does not poison the cell as an anode. Anodes made from platinum, nickel, tungsten, gallium, and stainless steel have been successfully tested. This plating method is further described in Example 5.

For some metals, such as gallium, it may facilitate further handling to subject a liquid coated tape (coated by any of the above methods) to a relatively low-temperature anneal which allows the metal to form an intermetallic phase with the silver at the surface of the tape.

In another embodiment of the invention, the coating and diffusion steps may be combined, by placing the superconducting composite in a solute-rich environment at the desired diffusion temperature, e.g., a gallium or gallium/silver bath at 450° C.

Long lengths of coated superconducting composite tape can be annealed in a batch process by co-winding the coated tape with a stainless steel tape on a reel to form a pancake coil. The pancake coil can then be laid flat in the furnace and diffusion heat treated. The stainless steel and the treated composite can be easily unwound and separated after heat treating, and the stainless steel tape can be reused or disposed of. Heat treatment may also be carried out by winding the coated tape on a mandrel (e.g., an alumina mandrel). The tape may be wound in a single layer, or parting agents may be used to treat multiple layers.

For some applications such as those using multiple lengths of high resistivity conductor, it may be important that the variation in sheath resistivity for the multiple lengths be minimized. The invention includes process control steps whereby this may be achieved. In the technique, composite superconducting tapes are coated with a slight excess of gallium, and sheath resistivity is directly measured during the diffusion heat treatment. When the resistivity reaches a selected value, the furnace is turned off to halt the heat treatment. While some additional diffusion will probably occur during cooling, this system significantly reduces batch-to-batch variation in resistivity.

EXAMPLES

Example 1
Ga—Ag Alloy Matrix

Pure silver-sheathed monofilamentary BSCCO 2223 composite tapes were fabricated by the standard oxide powder in tube process. After the final sintering step, the critical wire current was about 16 A at 77 K (1 $\mu$V/cm criterion). Ten 15 cm lengths were then coated with Ga manually by dipping latex gloved fingers into molten Ga at about 40° C., followed by repeated forward and reverse swabbing onto the Ag tape surface of the Ga pool on the glove fingers while slightly compressing the tape between those fingers. The central region (about 3 inches long) was cut from each tape and weighed. The known oxide fill factor and the external tape dimensions allowed calculation of the weight percent Ga deposited relative to the silver sheath weight. The average weight gain was 11.23%. Samples were subjected to 2 and 4 hour bakes at 480° C. in Cu-gettered argon, followed by $I_c$ and resistivity measurements. The results are in Table 1 below. It will be seen that while both the 2 and 4 hour bakes increased the resistivity of the matrix, the 4 hour bake also resulted in excessive degradation of the superconducting wires, as can be seen by the low values of $I_c$ final/$I_c$ initial for these wires.

TABLE 1

| Temperature (C.) | Time (hrs) | Resistivity at 77K ($\mu\Omega$-cm) | $I_c$ (A) | $I_c$ final/ $I_c$ initial |
| --- | --- | --- | --- | --- |
| 480 | 2 | 6 | 13.6 | 0.85 |
|  |  |  | 13.9 | 0.87 |
| 480 | 4 | 6.2 | 2.3 | 0.14 |
|  |  |  | 10.3 | 0.64 |

Example 2
Resistivity of Pure Silver Tapes

Pure silver tapes were also subjected to the coating method described in Example 1 to assess the resistivity potential of Ga—Ag alloys and the coat and diffuse process. These samples were heat treated for 25 hours at 480° C. in Cu-gettered argon. The resistivity data presented in Table 2 illustrates that the Ga—Ag solid solution formed by the coat and diffuse method can attain resistivities of greater than 25 $\mu\Omega$-cm.

TABLE 2

| wt % Ga | Resistivity at 77K ($\mu\Omega$-cm) |
| --- | --- |
| 8.1 | 12.8 |
| 10.2 | 22.4 |
| 10.7 | 28.4 |
| 13.8 | 31.3 |

Example 3
Meniscus/gravity Controlled Dip Coating

Pure silver-sheathed mono filamentary Bi-2223 composite tape was fabricated by the standard oxide powder in tube process to a cross-sectional dimension of 0.011 cm×0.221 cm. The tape exhibited an average critical current ($I_c$ at 77 K, self field, 1 $\mu$V/cm criterion) of 23.4 A with a 2.04 A standard deviation. The corresponding engineering current density ($J_e$) was 9.68 kA/cm². Two long segments of this tape were then dip coated at two different travel speeds, ~25 cm/min and ~33.5 cm/min. The coating method consisted of pulling the tape upward through a slot in a silicone rubber seal into a molten Ga bath held at 50° C., with the tape traveling about 4" through the molten Ga, exiting upward out of the Ga, dragging Ga into a relatively uniform coating on its surface. The thickness of this coating was dependent on the travel speed, with the faster speed producing a thicker Ga layer. The tape was then chilled, and wrapped onto a mandrel followed by a "drying" anneal consisting of 4 hrs at 80° C., a process which formed Ga—Ag intermetallic at the tape surface from the molten Ga, thereby allowing much easier subsequent in-process handling. The tape was then cut into test samples (each about 4" long), which were used to investigate the effects of time at Ga diffusion temperature on $I_c$ and average resistivity. The addition of the Ga to the sheath immediately reduced $J_e$ to a value of 8.25 kA/cm² for the 25 cm/min coating speed, by increasing the amount of non-superconducting material in the wire.

For the diffusion experiments, five samples cut from the long length were placed and sealed into the ambient temperature end region of a preheated furnace. The atmosphere of the furnace was either purged with Cu-gettered Argon or air, and samples were thrust in the 480° C. preheated hot zone of the furnace (heating to temperature in less then 2 minutes). Samples were held in the hot zone for a time in the range of 30–120 minutes and pulled out, thereby rapidly quenching their temperature back to ambient. The samples were then tested for their 77 K, self-field $I_c$ levels using a standard four point probe method with two sets of 1 cm-spaced voltage taps. Sheath resistivity was determined by measuring voltage between 1 cm spaced taps while a fixed small current was passed through each composite as it was cooled down to the transition temperature of a superconductor (~110 K), followed by extrapolation of the typically straightline voltage temperature dependence to 77 K. From the voltage v. temperature data, resistivity is given by Equation 1, where V is measured voltage, A is the cross-sectional area of the sheath assuming the superconductor above $T_c$ has a high resistivity compared to the matrix, I is the applied fixed current, and x is the spacing between the voltage taps.

Data is summarized in Table 3. The diffusion conditions listed produced retained $I_c$ levels above 50%, with corresponding $J_e$ levels above 4 kA/cm² at 77 K. Resistivities ranged from 5.1 to 13 $\mu\Omega$-cm—all exceeding the minimum 3 $\mu\Omega$-cm level required in many current limiting applications.

TABLE 3

| Coating speed (cm/min) | weight gain (% rel to Ag) | Ga diffusion treatment | retained $I_c$ (%) | $J_e$ (kA/cm²) | sheath resistivity ($\mu\Omega$-cm) |
| --- | --- | --- | --- | --- | --- |
| 25 | 10.8 | .5 hr 480° C., Ar | 92 | 7.43 | 5.1 |
| 25 | 10.8 | 1 hr 480° C., Ar | 78 | 6.24 | 7.9 |
| 25 | 10.8 | 2 hr 480° C., air | 64 | 5.22 | 11.6 |
| 33.5 | 15 | .5 hr 480° C., air | 63 | 4.66 | 8.33 |

TABLE 3-continued

| Coating speed (cm/min) | weight gain (% rel to Ag) | Ga diffusion treatment | retained $I_c$ (%) | $J_e$ (kA/cm²) | sheath resistivity (μΩ-cm) |
|---|---|---|---|---|---|
| 33.5 | 15 | 1 hr 480° C., air | 54 | 4.02 | 13.0 |

Example 4
Roll Coating

Figure 2A:
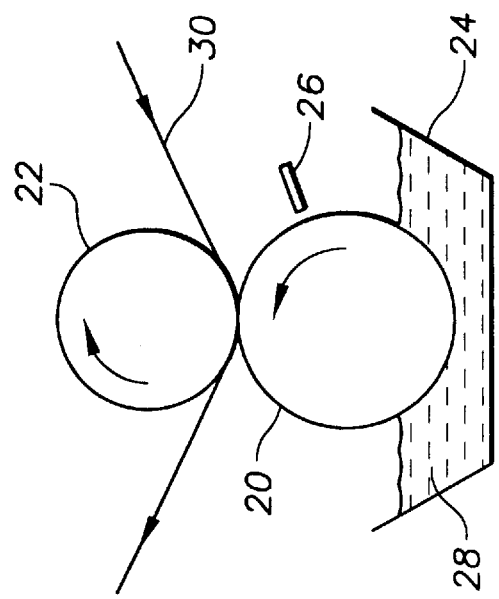
FIGS. 2a and 2b illustrate two roll coaters which may be used to coat a metal-sheathed superconductor with a liquid.
Figure 2B:
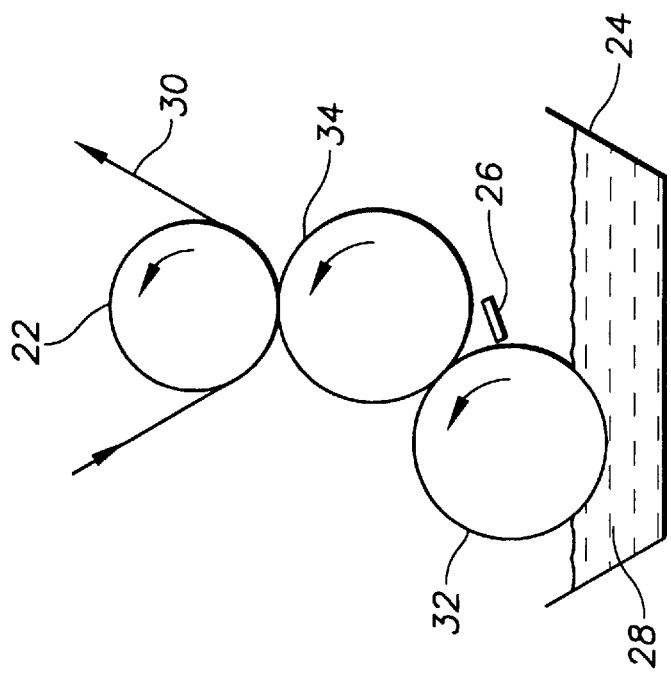

A desired amount of gallium or another liquid metal can be applied to the exterior of a metal-sheathed superconductor via a roll coating apparatus as shown in FIGS. 2a and 2b.

The roll coater of FIG. 2a comprises a feed roll 20, a backup roll 22, a sump 24, and a doctor blade 26. The exterior surface of the feed roll 20 is preferably of a material which is not degraded by the molten metal, and may for example comprise an elastomer or other polymer, ceramic, or metal surface. Most preferably, the exterior of the roll 20 is an elastomer with a surface profile which aids in the transport of gallium. Desirable surface profiles include but are not limited to textured finishes produced by grinding and quadrangle or pyramid cells similar to those used in gravure printing.

Feed roll 20 is mounted horizontally and partially submerged in liquid gallium 28 (or another liquid metal) which is contained in the sump 24. When feed roll 20 is rotated as shown in FIG. 2a, gallium will be transported on its surface. The doctor blade 26, which is mounted peripherally to the feed roll 20, will act to level and regulate the delivery of gallium. Subsequently, the metal-sheathed superconductor 30 will be brought by action of the backup roll 22 into contact with the gallium layer on the feed roll 20 and some or all of the gallium will be transferred to the surface of the superconductor sheath 30. The sheathed superconductor can move in the same or opposite direction as the feed roll surface. The former is referred to as "forward" roll coating, and the latter as "reverse" roll coating.

The second side of the sheathed superconductor 30 can be coated by inverting the superconductor and then passing it through the same or another roll coating apparatus.

In an alternative design, the doctor blade 26 of FIG. 2a would be replaced by a metering roll (not shown) which would both level and regulate the delivery of gallium. The gallium would be regulated not only by the gap between the feed roll 20 and the metering roll, but also by the direction and speed of rotation of the metering roll. The use of a metering roll may provide several advantages including the reduced wear of the feed roll surface.

In another alternative design, the feed roll 20 would not be partially submerged in molten gallium 28 contained in the sump 24 of FIG. 2a. Instead, the gallium would be supplied to the feed roll surface through a nozzle or slit (not shown) mounted adjacent to the feed roll 20. This would reduce foaming and other undesirable effects such as oxidation, which can occur due to introduction of gases into the gallium. In this design, any excess gallium would be collected in the sump 24 and returned to the gallium supply.

The roll coater of FIG. 2b comprises a feed roll 32, a transfer or offset roll 34, a backup roll 22, a sump 24, and a doctor blade 26. The feed roll 32 functions in substantially the same manner as the feed roll 20 of FIG. 2a described above. Again, it may be partially submerged in the molten gallium 28, or gallium can be applied to its surface from a nozzle (not shown). Either a metering roll (not shown) or a doctor blade 26 may be used as described above to regulate the delivery of gallium.

Some or all of the gallium transported on the surface of the feed roll 32 is transferred to the offset or transfer roll 34. The details of this transfer are controlled at least by the direction and speed of rotation of each of the two rolls and by the spacing between them.

The metal-sheathed superconductor 30 to be coated is brought into contact with the gallium layer on the transfer or offset roll 34 and some or all of the gallium will be transferred to the surface of the superconductor sheath 30. Either forward or reverse roll coating configurations may be used. After coating on one side, the sheath can be inverted and coated on the other side by the same or another roll coater.

Example 5
Electroplating

In preparation for electroplating, an electrolyte was made by dissolving 67 grams of $Ga_2O_3$ into 1 liter of 5 molar NaOH at approximately 70° C. The electrolyte was allowed to cool to room temperature prior to plating. The plating equipment consisted of a DC power supply, the electrolyte, and a solid gallium electrode. The material to be plated was a composite tape having dimensions of 0.01164 cm thick, 0.3745 cm wide, 40 cm long, and a 40% fill factor. For the plating process, the composite tape was made the cathode and the gallium electrode was made the anode. A cathodic current density of 0.6 A/cm² was applied for 30 seconds. The resulting tape thickness was 0.01336 cm providing for a 8.6 μm gallium plating thickness. The plated tape was cut into four 10 cm lengths and heat treated for 1 hour at 100° C. in air then 4 hours at 450° C. in air. Electrical measurements done at room temperature yielded longitudinal sheath resistivities of 5.84 μΩ-cm. Critical current testing done at 77 K yielded an average $I_c$ of 37.52 A (self field, 1 μV/cm). Identical critical current tests done on control samples (non-plated and diffusion processed) yielded an average $I_c$ of 35.01 A, indicating that the post-processing did not degrade the superconducting filaments.

Example 6
Mechanical Testing of Alloyed Matrix

Pure silver strips nominally 2.45 mm×0.095 mm in cross-section were coated with Ga at ambient temperature via dip coating. The samples were weighed before and after coating to determine the quantity of Ga. The samples were then heated to 480° C. and held at temperature for different lengths of time in Cu-gettered argon. Finally, the strips were quenched to ambient temperature. The strips were then tested for tensile strength and ductility, using an Instron mechanical testing machine. Results are presented in Table 4.

TABLE 4

| wt % Ga | diffusion time (hrs) | yield strength (MPa) | tensile strength (MPa) | elongation to fracture (%) |
|---|---|---|---|---|
| 6.8 | 1 | 142 | 267 | 14.5 |
| 6.8 | 2 | 108 | 239 | 20.3 |
| 6.8 | 4 | 102 | 216 | 16 |
| 11 | 4 | 123 | 231 | 23.2 |
| 15 | 4 | 143 | 292 | 11.1 |

These results clearly show that the alloys were quite ductile, with all samples fracturing above 10% strain. Their yield strengths were quite high, and their tensile strengths even higher.

Example 7
Mechanical Testing of Composite Tapes

Fully processed monofilament BSCCO 2223 tape samples were coated with Ga using a dip method to 6.2 and 12.3 wt % with respect to the silver. The tapes were nominally 1.73 mm wide and 0.191 mm thick, with 45 vol % BSCCO 2223. After coating, the samples were heated to 480° C. in Cu-gettered argon, held at temperature for 4 hours, and quenched back to ambient temperature. Samples were then wound onto a 2.55 mm diameter rod (tape surface tensile strain of about 7.5%) and examined for surface damage.

Neither macroscopic nor microscopic observation showed any signs of surface cracking. This strain level is more than 10-fold greater than the strain tolerance of HTS oxides such as BSCCO 2223. Although the tests were completed at ambient temperature, the results are expected to apply equally well at cryogenic temperatures.

Example 8
Meniscus/gravity Controlled Dip Coating with Further Post-diffusion Processing Pure silver-sheathed monofilament Bi-2223 composite tape was fabricated by the standard oxide powder in tube process to a cross-sectional dimension of 0.115 mm×1.85 mm. The tape exhibited an average critical current ($I_c$ at 77 K, self field, 1 $\mu$V/cm criterion) of 18.6 A. The corresponding engineering current density ($J_e$) was 8.74 kA/cm². A long segment of this tape was then dip coated at a speed of approximately ~25 cm/min. As in Example 3, the coating method consisted of pulling the tape upward through a slot in a silicone rubber seal into a molten Ga bath held at 50° C., with the tape traveling about 4" through the molten Ga, exiting upward out of the Ga, dragging Ga into a relatively uniform coating on its surface. The tape was then chilled, and wrapped onto a mandrel followed by a "drying" anneal consisting of 2 hrs at 90° C., a process which formed Ga—Ag intermetallic at the tape surface from the molten Ga, thereby allowing much easier subsequent in-process handling. The tape was then cut into test samples (each about 4" long). The addition of the Ga to the sheath immediately reduced $J_e$ to a value of 7.39 kA/cm² by increasing the amount of non-superconducting material in the wire.

Twelve samples cut from the long length were placed and sealed into the ambient temperature end region of a preheated furnace. The atmosphere of the furnace was purged with either Cu-gettered Argon or air, and samples were thrust in the 450° C. preheated hot zone of the furnace (heating to temperature in less then 2 minutes). Samples were held in the hot zone for 120 or 240 minutes and pulled out, thereby quenching their temperature back to ambient.

After diffusion treatments, the gallium-treated silver sheathed monofilament BSCCO 2223 composite tapes have an oxide layer on their surfaces which gives the tapes a dull matte finish. This presence of this oxide layer may interfere with soldering of these conductors either during subsequent processing or during end product fabrication. The twelve test samples were divided into three lots to investigate the effects of oxide removal method on $I_c$. The first lot of four sample tapes were abraded using 600 grit silicon carbide grinding paper to remove the oxide and to create a fresh specular silver alloy surface. The second lot of four sample tapes were chemically etched for approximately three minutes in a solution of 50 parts ammonium hydroxide ($NH_4OH$), 10 parts hydrogen peroxide ($H_2O_2$), and 50 parts water. This etching removed the oxide and created a specular silver alloy surface. The third lot of four samples was maintained as a control group.

The samples were then tested for their 77 K, self-field $I_c$ levels using a standard four point probe method with two sets of 1 cm-spaced voltage taps. Sheath resistivity was determined by measuring voltage between 1 cm spaced taps while a fixed small current was passed through each composite as it was cooled down to the transition temperature of the superconductor (~110 K), followed by extrapolation of the typically straightline voltage temperature dependence to 77 K.

Data is summarized in Table 5. The additional process steps of chemical etching or abrasion after diffusion heat-treatments resulted in significantly higher values of $I_c$ retention (76 and 80% compared to 46%). The resistivities ranged from 9.8 to 9.9 $\mu\Omega$-cm—all exceeding the minimum 3 $\mu\Omega$-cm level required in many current limiting applications.

TABLE 5

| Wt % Gallium (relative to Ag) | Drying and Diffusion Conditions | Oxide removal method | Retained $I_c$ (%) | Average $J_e$ (kA/cm²) | Sheath resistivity ($\mu\Omega$-cm) |
|---|---|---|---|---|---|
| 11 | 2 hours at 90° C. and 2 hours at 450° C. | none | 46 | 3.16 | 9.9 |
| 11 | 2 hours at 90° C. and 2 hours at 450° C. | chemical etching | 76 | 5.79 | 9.8 |
| 11 | 2 hours at 90° C. and 4 hours at 450° C. | abrasion | 80 | 6.61 | not measured |

Other embodiments of the invention will be apparent to those skilled in the art from a consideration of the specification or practice of the invention as disclosed herein. It is intended that the specification and examples be considered as exemplary only, with the true scope and spirit of the invention being indicated by the following claims.

What is claimed is:

1. An oxide superconductor article, comprising:
   at least one oxide superconducting member in a silver-containing matrix, the matrix having a bulk resistivity greater than 3 $\mu\Omega$-cm at a temperature of 77 K, and a tensile fracture strain of greater than 0.5%, wherein no metallic constituent of the matrix has a boiling point of less than 380° C. at 1 atmosphere pressure.

2. The oxide superconductor article of claim 1, wherein the matrix comprises a silver-rich solid solution of silver with at least one other element selected from the group consisting of gallium, tin, cadmium, zinc, indium, and antimony.

3. The oxide superconductor article of claim 1, wherein the matrix comprises a silver-rich solid solution of silver with at least one other element having a diffusivity in silver sufficient to allow the element to diffuse into the silver in less than twenty hours at a temperature of less than 550° C.

4. The oxide superconductor article of claim 1, wherein the matrix comprises a silver-rich solid solution of silver with at least one other element having a diffusivity in silver of at least $10^{-12}$ cm²/s at a temperature of less than 550° C.

5. The oxide superconductor article of claim 1, wherein the oxide superconducting member comprises BSCCO 2223 phase.

6. The oxide superconductor article of claim 1, wherein the oxide superconducting member comprises BSCCO 2212 phase.

7. The oxide superconductor article of claim 1, wherein the oxide superconducting member comprises a member of the YBCO family of oxide superconductors.

8. The oxide superconductor article of claim 1, wherein the matrix has a grain size of less than 50 µm.

9. The oxide superconductor article of claim 1, wherein the matrix has a grain size in the range of 0.1–15 µm.

10. The oxide superconductor article of claim 1, wherein the matrix comprises a silver-rich solid solution of silver and at least one solute element, where the solute element comprises at least 2 atm % of the bulk matrix composition.

11. The oxide superconductor article of claim 1, wherein the matrix comprises a silver-rich solid solution of silver and at least one solute element, where the solute element comprises at least 4 atm % of the bulk matrix composition.

12. The oxide superconductor article of claim 1, wherein the matrix comprises a silver-rich solid solution of silver and at least one solute element, where the solute element comprises between 4 atm % and 50 atm % of the bulk matrix composition.

13. The oxide superconductor article of claim 1, wherein the matrix comprises a silver-rich solid solution of silver and at least one solute element, where the solute element comprises between 4 atm % and 18 atm % of the bulk matrix composition.

14. The oxide superconductor article of claim 1, wherein the bulk matrix resistivity is greater than 5 µΩ-cm.

15. The oxide superconductor article of claim 1, wherein the bulk matrix resistivity is in the range of 5–25 µΩ-cm.

16. The oxide superconductor article of claim 1, wherein the matrix has a tensile fracture strain of greater than 1%.

17. The oxide superconductor article of claim 1, wherein the matrix has a bend fracture strain of greater than 0.5%.

18. The oxide superconductor article of claim 1, wherein the matrix has a bend fracture strain of greater than 1%.

19. The oxide superconductor article of claim 1, wherein the article has an engineering critical current density of at least 3,000 A/cm$^2$ at a temperature less than or equal to 90 K.

20. The oxide superconductor article of claim 1, wherein the oxide superconducting member has a critical temperature of at least 70 K.

* * * * *